United States Patent [19]

Endo et al.

[11] Patent Number: 4,875,101
[45] Date of Patent: Oct. 17, 1989

[54] SOLID STATE PHOTOVOLTAIC IMAGING DEVICE WITH EXCESS CHARGE ELIMINATOR

[75] Inventors: Yukio Endo; Nozomu Harada, both of Yokohama, Japan

[73] Assignee: Kabushiki Kaisha Toshiba, Kawasaki, Japan

[21] Appl. No.: 94,002

[22] Filed: Sep. 4, 1987

[30] Foreign Application Priority Data

Sep. 11, 1986 [JP] Japan .................. 61-212557

[51] Int. Cl.⁴ .......................... H04N 5/335
[52] U.S. Cl. .................... 358/213.19; 358/213.14
[58] Field of Search ............. 358/213.19, 213.23, 358/213.24, 213.26

[56] References Cited

U.S. PATENT DOCUMENTS 4,647,978  3/1987  Kinoshita et al. .......... 358/213
4,733,302  3/1988  Kinoshita et al. .......... 358/213

FOREIGN PATENT DOCUMENTS

56-140773  11/1981  Japan .
31672   2/1983  Japan ................. 358/213.14

Primary Examiner—James J. Groody
Assistant Examiner—Robert M. Bauer
Attorney, Agent, or Firm—Oblon, Fisher, Spivak, Mclelland & Maier

[57] ABSTRACT

A multilayered CCD image sensor having semiconductive cells aligned on a substrate to define picture elements of the image sensor, and a photosensitive layer, which is provided above the substrate, is conducted to the semiconductive cells, and photovoltaicly generates charges of light radiation thereon. A vertical charge transfer section is provided on the substrate and is elongated to be parallel to a linear cell array. A horizontal charge transfer section is coupled to one end portion of the vertical charge transfer section, and a drain layer for sweeping out excess charges is coupled to the other end portion of the vertical charge transfer section. In a normal signal charge readout mode, signal charges from the cells are normally transferred to the horizontal charge transfer section through the vertical charge transfer section. A sweep-out operation of excess charges is performed during a vertical blanking period. In this case, excess charges left in the vertical charge transfer section are transferred through the vertical charge transfer section in a direction opposite to that in the normal signal charge readout mode, and are discharged to the drain layer. No excess charges flow into the horizontal charge transfer section.

8 Claims, 7 Drawing Sheets

F I G. 1

F I G. 2

F I G. 4A

F I G. 4B
(period A)

F I G. 4C
(period B)

F I G. 4D
(period C)

F I G. 4E
(period D)

F I G. 4F
(period D)

F I G. 4G
(period E)

F I G. 4H
(period F)

F I G. 4I
(period F)

F I G. 8B
(period A)

F I G. 8C
(period B)

F I G. 8D
(period C)

F I G. 8E
(period D)

F I G. 8F
(period D)

SOLID STATE PHOTOVOLTAIC IMAGING DEVICE WITH EXCESS CHARGE ELIMINATOR

BACKGROUND OF THE INVENTION

The present invention relates to a solid-state imaging device and, more particularly, to a solid-state image sensing device having a photoconductive film layer which is stacked to cover a photosensitive cell arrangement.

As a typical solid-state imaging device, a multi-layered CCD image sensor is known, wherein a photoconductive thin film is stacked on a normal CCD device, and an effective opening ratio of the image sensor is increased, whereby the utilization efficiency of incident image light is increased, so that the photoelectric sensitivity can be improved. With the image sensor of this type, since most incident image light is absorbed by the photoconductive thin film, the necessity of charge generation inside a chip substrate is reduced, and hence, a smear phenomenon inherent to the solid-state image sensor can be prevented.

However, the conventional multilayered CCD image sensor suffers from degradation in the reproduced image quality due to blooming and/or afterimage. More specifically, when the image sensor of this type is constituted by an interline transfer CCD image sensor, a signal charge capacity (i.e., a maximum amount to which signal charges generated upon irradiation of incident light can be accumulated therein) of a photoelectric transducer cell section is normally set to be larger than a capacity of a vertical charge transfer section or a horizontal charge transfer section, which is also known as a horizontal CCD shift register section (i.e., a maximum amount of signal charges to be transferred). When strong light is incident on the image sensor, excess signal charges (called "excess-charges") produced in the photoelectric transducer cell section in response thereto overflow while being transferred in the transfer section. For example, if one of the packets of signal charges of adjacent pixels overflows from a corresponding potential well formed in a substrate and is mixed with the other packet, this induces the blooming phenomenon or afterimage. As a result, the quality of a reproduced image is degraded.

According to Japanese Patent Disclosure (KOKAI) No. 140773/81, a technique is proposed wherein, in the CCD image sensor, excess charges in a transfer section are swept out to a CCD output section through a horizontal CCD shift register section upon application of a high-speed sweep-out pulse signal to vertical charge transfer sections in a vertical blanking period of the CCD image sensor. However, with this technique, the sweep-out of the excess charges is limited to a relatively short vertical blanking period. In addition, the excess charges are transferred to the output section by simply continuously applying a high-frequency pulse signal during the vertical blanking period, and are discharged therefrom. The excess charges to be swept out are transferred through the vertical charge transfer sections in the same direction as a transfer direction for reading out normal signal charges, and are discharged to the CCD output section. Therefore, a sweep out capability of the excess charges is limited, since it is difficult, due to limitations of the circuit design, to set the frequency of the sweep-out pulse signal too high. Therefore, it is difficult to realize a CCD image sensor having a wide dynamic range.

Japanese Patent Application No. 90416/84 teaches a technique wherein, in the CCD image sensor, after excess charges are transferred from a photoelectric transducing cell section to a vertical charge transfer section, the potential of the electrode of the vertical charge transfer section is forcibly set at a predetermined potential level, and the excess charges are averaged along the longitudinal direction of the vertical charge transfer section. Thereafter, the excess charges which are averaged along the longitudinal direction of the vertical charge transfer section are discharged to the output section through a horizontal CCD shift register section. With this technique, however, when excessively strong image light is radiated and too many excess charges are introduced to the vertical charge transfer section accordingly, charges overflow during transfer. Therefore, satisfactory improvement of blooming and afterimage cannot be expected. Therefore, it is difficult to realize a CCD image sensor with a wide dynamic range.

SUMMARY OF THE INVENTION

It is therefore an object of the present invention to provide a new and improved multilayered solid-state image sensing device which can effectively discharge excess charges, and can improve its dynamic range.

In accordance with the above object, the present invention is addressed to a specific image sensor, which comprises semiconductive cells aligned on a substrate to define picture elements of the image sensor, and a photosensitive layer which is arranged above the substrate, conducted to the semiconductive cells, and photovoltaicly generates, upon light radiation thereto, charges which are supplied to the semiconductive cells and are accumulated therein. A vertical charge transfer register section is arranged on the substrate and is elongated parallel to a linear cell array. A horizontal charge transfer register section is coupled to one end portion of each vertical charge transfer register section, while a drain layer for sweeping out excess charges is coupled to the other end portion of the vertical charge transfer register section.

During an effective period for reading out normal signal charged of the image sensor, the vertical charge transfer register section transfers charges therein to one end portion thereof. Therefore, these charges are transferred to the horizontal charge transfer register section as signal charges, and are output therethrough from the output terminal of the image sensor. On the other hand, during a vertical blanking period of the image sensor, the vertical charge transfer register section transfers residual charges therein to the other end portion thereof. These charges are transferred inside the vertical charge transfer register section in a direction opposite to that in the normal signal charge readout mode, and are discharged to the drain layer.

The invention, its objects, and advantages will become more apparent from the detailed description of the preferred embodiment presented below.

BRIEF DESCRIPTION OF THE DRAWINGS

In the detailed description of a preferred embodiment of the present invention presented below, reference is made to the accompanying drawings of which.

DETAILED DESCRIPTION OF THE PREFERRED EMBODIMENTS

Figure 1:
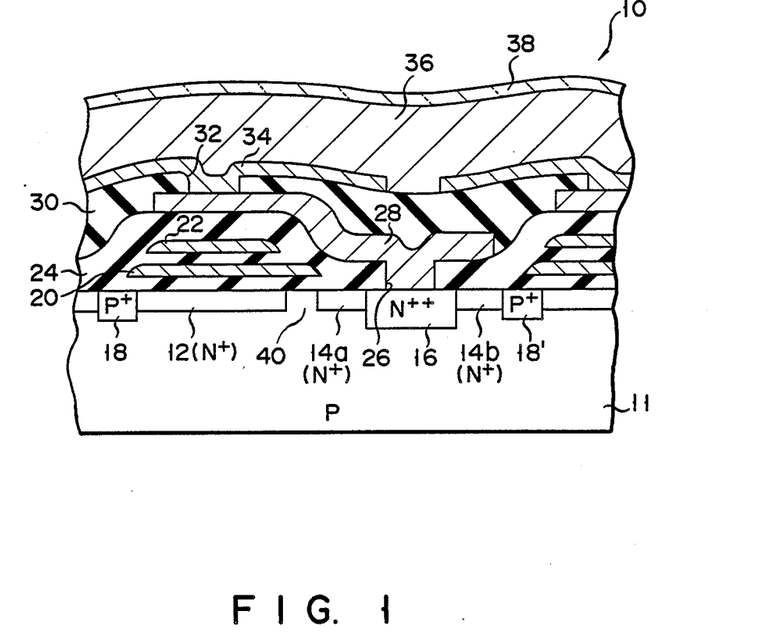
FIG. 1 is a diagram showing a principal sectional structure of a multilayered CCD image sensor according to a preferred embodiment of the present invention.

A multilayered solid-state image sensor shown in FIG. 1 includes an interline transfer type charge coupled device, and is generally denoted by reference numeral "10" in FIG. 1. As shown in FIG. 1, P conductive type silicon substrate 11 has a top surface in which first $N^+$ type diffusion layer 12 and second $N^+$ type layers 14a and 14b are formed. First $N^+$ layer 12 serves as a channel of a vertical charge transfer section of image sensor 10. Second $N^+$ layers 14a and 14b constitute a signal charge storage diode of a photoconductive cell in a signal charge storage section of image sensor 10. Highly-doped $N^{++}$ type diffusion layer 16 is formed in the substrate surface between $N^+$ cell diode layers 14a and 14b to be in contact therewith. $P^+$ type diffusion layer 18 (or 18') is formed in the substrate surface to be in contact with $N^+$ channel layer 12, and hence, serves as a channel stopper.

Conductive layers 20 and 22 of polysilicon are insulatively provided over substrate 11. Conductive layers 20 and 22 are located above $N^+$ channel layer 12, and are insulated from each other by gate insulating layer 24 and are also electrically insulated from $N^+$ channel layer 12. These conductive layers 20 and 22 serve as signal charge transfer electrodes. Gate insulating layer 24 is deposited on the top surface of substrate 11, and has opening 26 contacting the upper surface of $N^{++}$ diffusion layer 16. First metal layer 28 is formed on gate insulating layer 24, and covers opening 26 of layer 24. Therefore, first metal layer 28 is electrically connected to $N^{++}$ layer 16 through opening 26. Thus, $N^+$ cell diode layers 14a and 14b are conducted by (in ohmic contact with) metal layer 28 and $N^{++}$ layer 16. $N^{++}$ layer 16 will be referred to as an "ohmic contact layer" hereinafter, and opening 26 formed in gate insulating layer 24 will be referred to as a "contact hole" hereinafter.

Another gate insulating layer 30 is deposited on gate insulating layer 24 to cover first metal layer 28. Gate insulating layer 30 is in contact with a portion of first metal layer 28 which is located above conductive layers 20 and 22, and has opening 32 serving as a contact hole. Second metal layer 34 is provided for each picture element of the image sensor, and is formed on gate insulating layer 30 to cover opening 32, as shown in FIG. 1. Therefore, $N^+$ cell diode layers 14a and 14b formed in substrate 11 are electrically connected to metal layer 34 through ohmic contact layer 16 and metal layer 28.

Photoconductive layer 36 is provided on the above-mentioned multilayered structure. Photoconductive layer 36 covers the entire upper surface of the multilayered structure. Photoconductive layer 36 may be an amorphous silicon layer. Transparent electrode layer 38 is stacked on photoconductive layer 36. Transparent electrode layer 38 is an indium-tin oxide (ITO) layer in this embodiment.

$N^+$ cell diode layers 14a and 14b, ohmic contact layer 16, and first and second metal layers 28 and 34 constitute one photoconductive picture element (also called a "pixel") of the CCD image sensor of a plurality of picture elements aligned in a two-dimensional matrix. Second metal layer 34 defines an image sensing area of the corresponding picture element. When amorphous silicon layer 36 is irradiated with incident image light, charge carriers photovoltaicly produced in layer 36 change the potential of second metal layer 34. A change in potential in metal layer 34 is transmitted to $N^+$ cell diode layers 14a and 14b through first metal layer 28 and ohmic contact layer 16. Therefore, the charge carriers produced in layer 36 are temporarily stored or accumulated in $N^+$ cell diode layers 14a and 14b.

Polysilicon layer 20 is formed to cover substrate region 40 which is located between layers 12 and 14a in the top surface portion of substrate 11 and serves as a vertical signal charge transfer section, and therefore serves as a transfer electrode for sequentially transferring generated signal charges through vertical transfer section 40. In the image sensor, the capacity of the signal charge storage section (i.e., a maximum amount of charges to be stored) is determined by a sum of (1) a charge storage capacity of cell diode layers 14a and 14b, (2) a charge storage capacity of photoconductive layer 36, and (3) a charge storage capacity determined between metal electrode layers 28 and 32 and transfer electrode layers 20 and 22. The capacity of the signal charge storage section is larger than the transfer capacity(i.e., a maximum amount of charges to be transferred) of the signal charge transfer section.

Figure 2:
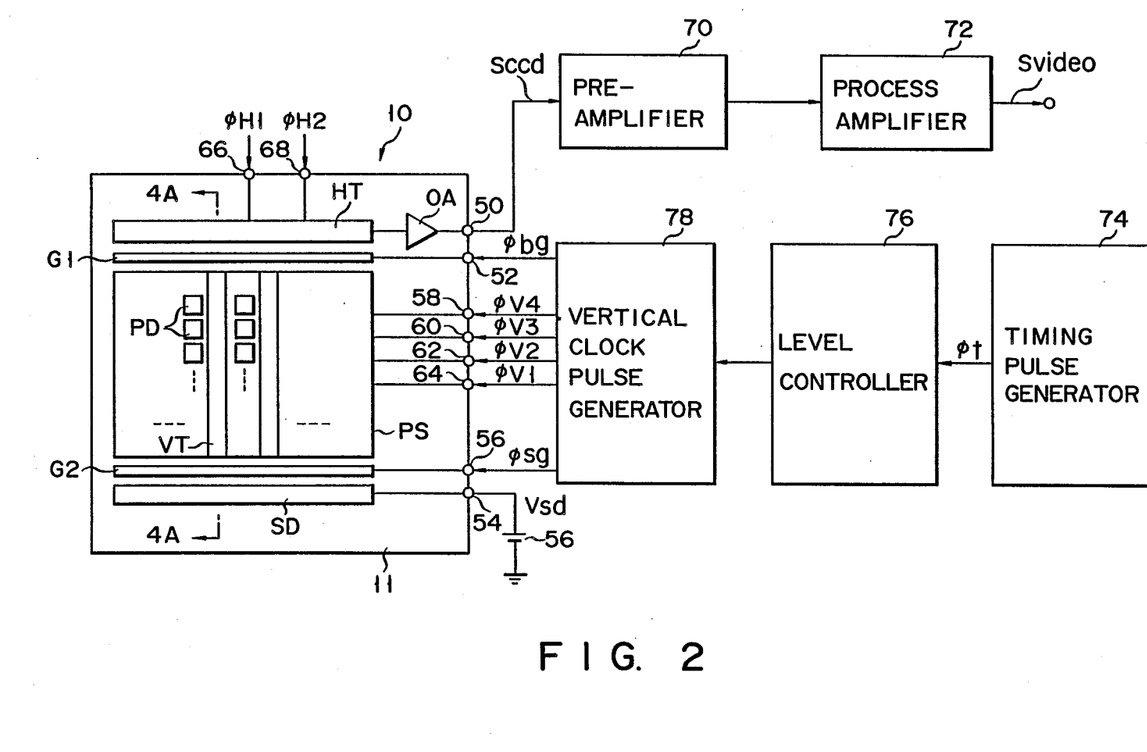
FIG. 2 is a block diagram showing the overall circuit arrangement of an image sensing system including the CCD image sensor shown in FIG. 1.

FIG. 2 schematically shows the planar structure of CCD image sensor 10 having the above multilayered structure, and a drive circuit arrangement therefor. Photosensing section PS consisting of picture element cells PD arranged in a two-dimensional matrix is provided on substrate 11. Each picture element cell PD has N+ cell diode layers 14 shown in FIG. 1. Vertical charge transfer sections (also called "vertical CC shift registers") VT are formed on substrate 11 to be elongated along the column direction in the matrix of picture element cells PD. Each section VT is adjacent to an array of picture elements PD aligned along the column direction of the substrate and is elongated parallel thereto. First end portions of section VT are coupled to horizontal charge transfer section (also called "horizontal CCD shift register") HT. Section HT extends in the row direction on substrate 11, and receives signal charge packets sequentially transferred from sections VT and transfers them to output amplifier OA incorporated in image sensor 10. Output CCD signal Sccd from amplifier OA is output through output terminal 50 of image sensor 10.

Gate electrode G1 is provided between the first end portions of sections VT and section HT. Gate electrode G1 is also known as a "bottom gate", and controls migration or flow of signal charges from sections VT to section HT. When gate control signal $\phi$bg is supplied to gate electrode G1 through terminal 52, gate electrode G1 is opened/closed in response to this signal, and controls migration of signal charges from sections VT to section HT.

Sections VT are coupled to semiconductor diffusion layer SD serving as an excess-charge sweep-out drain layer at their second end portions (i.e., end portions opposite to the first end portions). Sweep-out drain layer SD extends in the row direction on substrate 11, and is connected to D.C. battery 56 through terminal 54 of image sensor 10. D.C. battery 56 applies appropriately high D.C. voltage Vsd to drain layer SD. When signal charge packets are transferred from sections VT, sweep-out drain layer SD discharges these charges.

Gate electrode G2 is provided between the second end portions of section VT and sweep-out drain layer SD. Drain gate electrode G2 opens/closes a gate between sections VT and drain layer SD in response to drain gate control signal $\phi$sg supplied through terminal 56, thereby controlling migration or flow of excess charges from sections VT to drain layer SD.

In this embodiment, in order to sequentially transfer picture element signal charges in sections VT, four-phase clock pulse signals $\phi$V1, $\phi$V2, $\phi$V3, and $\phi$V4 are supplied to sections VT respectively through terminals 58, 60, 62, and 64. In order to sequentially transfer picture element signal charges in section HT, two-phase clock pulse signals $\phi$H1 and $\phi$H2 are supplied to section HT respectively through terminals 66 and 68.

Preamplifier 70 is connected to output terminal 50 of CCD image sensor 10, and amplifies image sensing signal Sccd output from terminal 50 and removes a noise component included in the signal by a known technique. Preamplifier 70 is connected to process amplifier 72. Process amplifier 72 performs image signal processing of the output image sensing signal from preamplifier 70, such as gamma correction, blanking processing, white clipping processing, and DC reproduction processing. Thus, amplifier 72 obtains normal video signal Svideo of a sensed image to be displayed on a display apparatus (not shown).

Figure 3A:
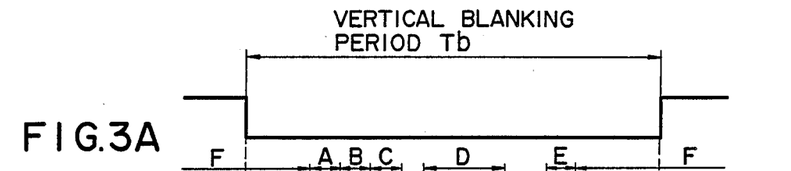
FIGS. 3A to 3H are diagrams showing waveforms of principal electrical signals generated in the principal sections of the circuit shown in FIG. 2 in an excess charge sweep-out mode performed during a vertical blanking period of the image sensor.
Figure 4A:
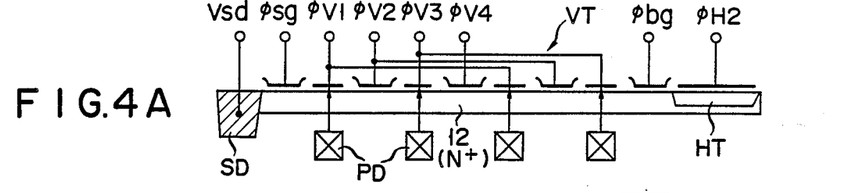
FIGS. 4A to 4I are views illustrating a change over time in potential well formed in a substrate region under a vertical charge transfer section in order to explain how to transfer excess charges to a drain section in the vertical charge transfer section of the image sensor.

Timing pulse generator 74 generates timing pulse signal $\phi$t for defining a fundamental timing of the internal operation of CCD image sensor 10. Timing pulse signal $\phi$t is supplied to level controller 76. Level controller 76 adjusts the amplitude of timing pulse signal $\phi$t so as to obtain potential levels as will be described later with reference to FIG. 3. Level controller 76 is connected to vertical clock pulse generator 78. Pulse generator 78 serves as a clock driver for generating various clock pulse signals such as transfer clock signals $\phi$V1 to $\phi$V4, bottom gate control signal $\phi$bg, and sweep-out gate control signal The CCD image sensing device with the above structure is featured in that residual excess charges in vertical charge transfer sections VT are discharged during vertical blanking period Tb of CC image sensor 10 to drain layer SD by two-step sweep-out operations, which will be described later in detail with reference to FIGS. 3 and 4. Note that the sectional structure of image sensor 10 shown in FIG. 4A corresponds to the sectional structure taken along line "4A—4A" of the image sensor shown in FIG. 2.

The excess-charge sweep-out operation of the present invention is performed during vertical blanking period Tb of image sensor 10, as shown in FIG. 3A. During vertical blanking period Tb, since gate control signal $\phi$sg supplied to drain gate S2 for controlling a charge flow toward drain layer SD has high potential level VsgH, as shown in FIG. 3F, drain gate G2 is opened. At this time, since gate control signal $\phi$bg supplied to bottom gate G1 for controlling a charge flow to section HT has low potential level VbgL as shown in FIG. 3G, the bottom gate is closed, and hence, charge transfer from sections VT to section HT is inhibited.

Figure 3B:
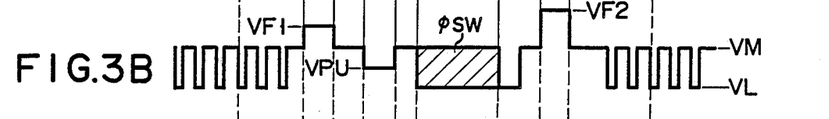
Figure 3C:
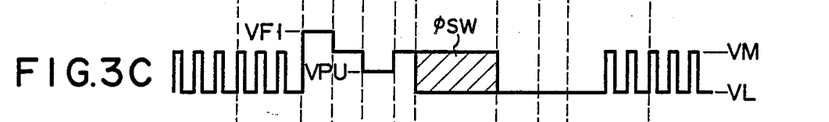
Figure 3D:
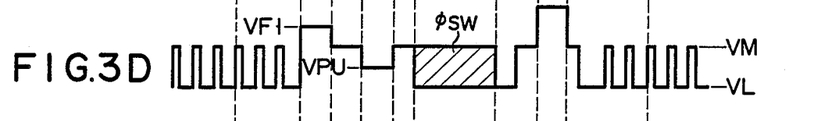
Figure 3E:
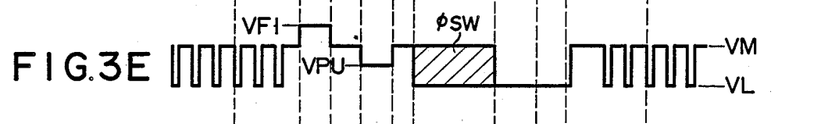
Figure 3F:
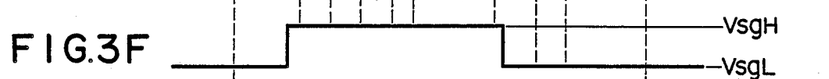
Figure 3G:
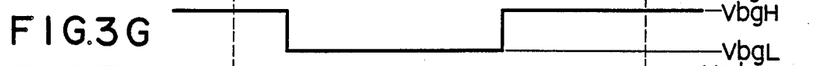
Figure 3H:
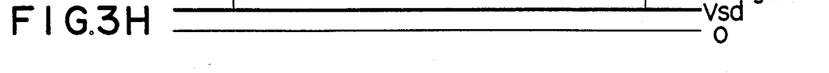

The excess-charge sweep-out operation of the present invention consists of a first charge sweep-out step executed during periods A, B, and C, and a second charge sweep-out step executed during period D and E, as shown in FIG. 3B. During period A of the first charge sweep-out step, constant positive voltage VF1 is applied to all the transfer electrodes of sections VT. FIGS. 3B to 3E respectively show signal waveforms of 4-phase transfer clock signals $\phi$V1, $\phi$V2, $\phi$V3, and $\phi$V4 applied to the vertical transfer electrodes. As can be seen from FIGS. 3B to 3E, these transfer clock signals $\phi$V1, $\phi$V2, $\phi$V3, and $\phi$V4 have the same voltage level VF1 during period A. Upon application of positive voltage VF1 to the transfer electrodes, potential wells 100 having a deep potential level are uniformly formed in the channel regions of sections VT. In this state, excess charges Q1 (which are produced upon incidence of incoming image light having an excess intensity) of picture element diodes PD are transferred to the channel regions of sections VT with a margin. During period A, since sweep-out gate G2 is opened in response to drain gate control signal $\phi$sg from vertical clock pulse generator 78, excess charges Q1 are partially discharged in drain layer SD, as indicated by arrow 102 in FIG. 4A. In this case, the potential of drain layer SD is maintained at predetermined potential Vsd, as shown in FIG. 3H, since drain layer SD is connected to D.C. battery 56 for generating voltage Vsd.

Figures 4B, 4C:
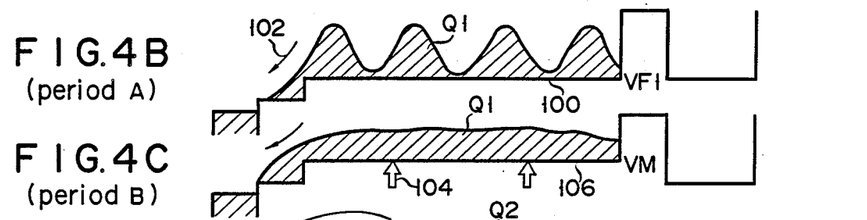

During following period B, positive voltage VM (see FIGS. 3B to 3E), having lower constant potential voltage VF1, is applied to all the transfer electrodes of sections VT. Then, the bottom of each uniform potential well formed in the channel region of each section VT is raised, as indicated by thick hollow arrows 104 in FIG. 4C, thus forming shallow potential well 106. Since the uniform potential wells formed in the channel regions of sections VT become shallow, excess charges Q1 flowing into drain layer SD are increased, and hence, the sweep-out operation of excess charge Q1 is accelerated.

During period C of the first charge sweep-out step voltage VPU (see FIGS. 3B to 3E) having a further lower constant positive potential level than voltage VM is applied to all the transfer electrodes of sections VT. Then, the bottom of the uniform potential well formed in the channel region of each section V is further raised, as indicated by thick hollow arrow 104 in FIG. 4D, thus forming further shallow potential well 108. Since the uniform potential wells formed in the channel regions of sections VT become shallow stepwise, the excess charges flowing into drain layer SD are further increased, and hence, the excess-charge sweep out operation is successively performed. After the completion of this step, a decreased amount of excess charges G2 is left in each potential well 108 (see FIG. 4D). In this state, the first charge sweep-out step of the excess-charge sweep-out operation of the present invention is completed. It should be noted that: constant voltage level VPU is appropriately set so that the amount of residual excess charges Q2 after the completion of the first charge sweep-out step is smaller than the capacity of sections VT, i.e., the maximum possible transfer charge amount of sections VT.

During vertical blanking period Tb, the excess-charge sweep-out operation of the present invention enters the second charge sweep-out step. In this case, vertical clock pulse generator 78 applies excess-charge sweep-out clock pulse signal $\phi$sw to sections VT through terminals 58, 60, 62, and 64, respectively. Pulse signal $\phi$sw has a high frequency of about 1 MHz. In FIGS. 3B to 3E, the waveform of clock pulse $\phi$sw is simply illustrated by hatched lines for the sake of illustrative convenience. In this operation mode, bottom gate G1 is closed, and drain gate G2 is kept open in the same manner as described above.

Figures 4D, 4E:
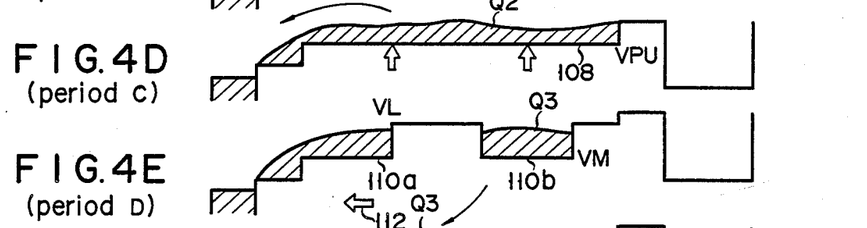
Figures 4F, 4G:
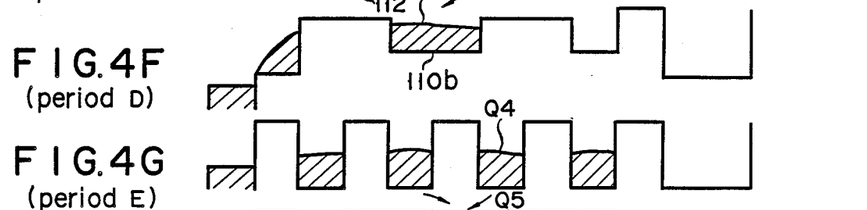

The second charge sweep-out step is performed to forcibly discharge excess charges Q2, left in potential wells 108 of the channel regions of sections VT after the completion of the first charge sweep-out step, into drain layer SD. In this case, pulse generator 78 applies four-phase high-frequency sweep-out pulse signal $\phi$sw to the transfer electrodes of sections VT, in such a manner that residual excess charges Q2 are sequentially transferred toward the second end portions coupled to drain SD in sections VT. More specifically, during period D, as shown in FIGS. 4E and 4F, since four-phase high-frequency sweep-out pulse signal $\phi$sw is alternately applied to the electrodes of sections VT, the residual excess charges are divisionally distributed to some potential wells 110a, 110b, . . . (the divided excess charges are denoted by reference numeral "Q3" in FIGS. 4E and 4F). The residual excess charges are sequentially transferred in a direction defined by thick hollow arrow 112 in FIG. 4F upon movement of these potential wells 110a, 110b, . . . , and are discharged to drain layer SD. Thus, the second charge sweep-out step is completed.

Subsequently, during periods E and F of vertical blanking period Tb, normal signal charges Q4 are transferred to section HT. In this case, since gate control signal $\phi$sg supplied to drain gate G2 is changed to have low potential level VsgL, as shown in FIG. 3F, drain gate G2 is closed. Since gate control signal $\phi$bg supplied to bottom gate G1 for controlling the charge flow to section HT is changed to have high potential level VbgH, as shown in FIG. 3G, bottom gate G1 is opened, and hence, charge transfer from sections VT to section HT is enabled.

Figure 4H:
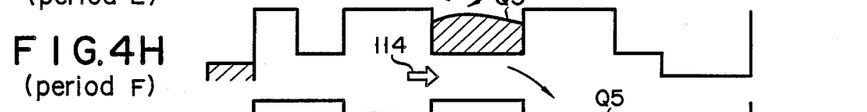
Figure 4I:
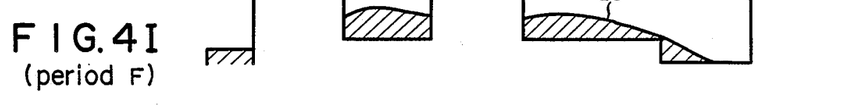

In order to transfer normal signal charges Q4 to section HT, during period E, field shift pulse signal $\phi$fs is applied to a known field shift gate electrode (not shown in FIG. 2) of each section VT, and normal signal charges Q4 are read out to sections VT from picture element diodes PD (see FIG. 4G). During next period F, normal signal charges Q4 read out from two adjacent picture element diodes PD are added to each other, as shown in FIG. 4H. (This charge addition processing is performed so that a combination of adjacent picture elements to be added is changed during odd- and even-numbered field periods included in one frame period, thereby improving a horizontal resolution density of a reproduced image.) Thereafter, as shown in FIG. 4I, the normal signal charges are sequentially transferred through sections VT in a direction defined by thick hollow arrow 114 in a known transfer manner in synchronism with a clock signal of a CCD transfer frequency of 15.75 kHz in units of added normal signal charges Q5, and are then transferred to section HT.

With the multilayered CCD image sensor, drain layer SD for sweeping out excess-charges is provided on substrate 11 on the side of the end portions opposite to the end portions of vertical charge transfer sections coupled to horizontal charge transfer section HT. Since drain layer SD is directly coupled to sections VT and bottom gate G1 is closed during the excess-charge sweep-out operation, excess charges are totally inhibited from flowing into section HT. Therefore, a possibility of mixing of the excess charges into the CCD output signal can be substantially eliminated. This fact can eliminate necessity of adopting a circuit arrangement having a wide dynamic range for a signal processing circuit section provided to the output stage of image sensor 10.

With the multilayered CCD image sensor, the excess charge sweep-out operation can be performed by combining two types of sweep-out methods (i.e., by carrying out the first and second sweep-out steps) during vertical blanking period Tb, so that the excess charges can be effectively discharged to drain layer SD. Therefore, blooming and afterimage (image lag) phenomena caused by the excess charges generated upon irradiation of excess image light onto CCD image sensor 10 can be minimized. As a result, the sensitivity and dynamic range of CCD image sensor 10 can be improved.

According to the first embodiment, image light is kept incident on CCD image sensor 10 during vertical blanking period Tb. If the light intensity becomes excessive, excess charges greater than the maximum possible charge transfer amount of vertical charge transfer section VT are generated, and a possibility of blooming and afterimage caused thereby still remains. In consideration of this problem, time lengths of excess-charge sweep-out periods A to D in the first embodiment are preferably as short as possible. Of periods A to D, period D requires the longest time length. For example, assuming that the excess-charge sweep-out frequency is 500 kHz, since the number of transfer stages of sections VT is normally 250, the time length of period D is about 500 microseconds. If time length tD of period D can be set to be less than 500 microseconds, blooming and afterimage preventing effects can be further enhanced. A second embodiment of the present invention described hereinafter aims at realizing this point, wherein a single-phase drive pulse signal is used as excess-charge sweep-out clock pulse signal $\phi sw$ used in period D. A circuit arrangement for generating the single-phase drive pulse is schematically shown in FIG. 5.

Figure 5:
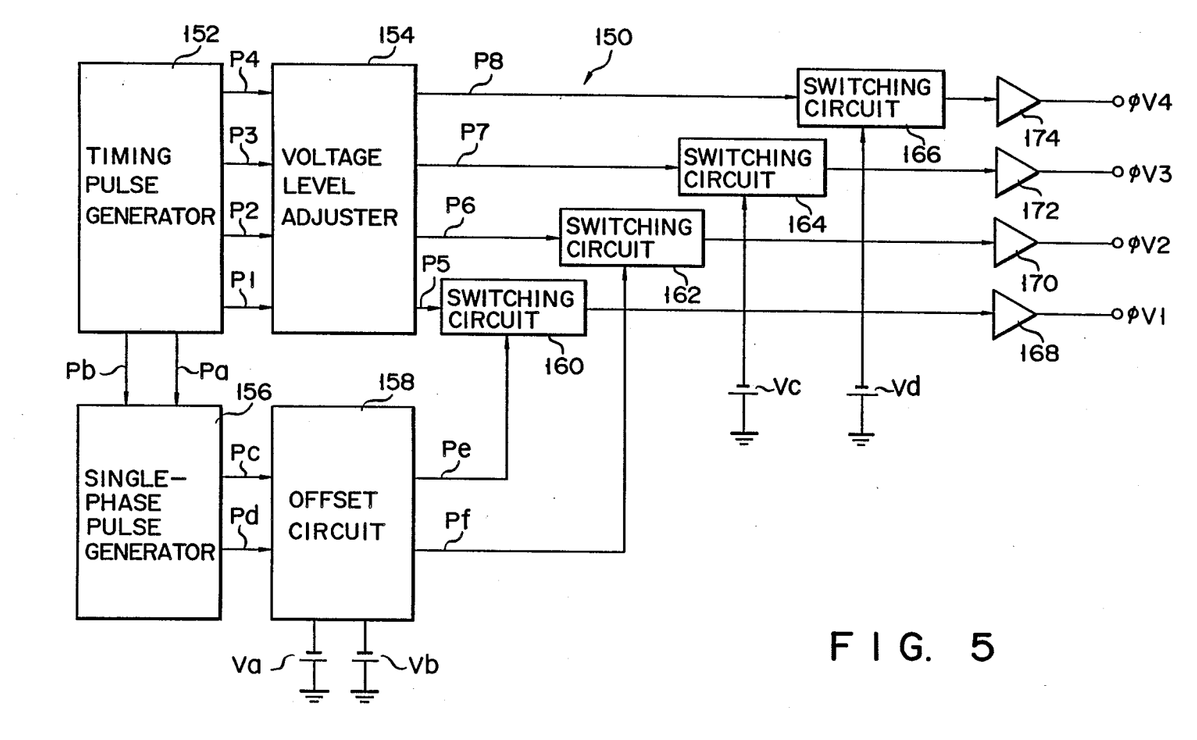
FIG. 5 is a block diagram showing the arrangement of an image sensor drive circuit according to another embodiment of the present invention, which is applied to an image sensing system including the multilayered CCD image sensor shown in FIG. 1.
Figure 6A:
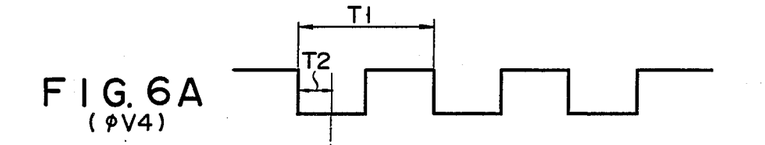
FIGS. 6A to 6D are diagrams showing waveforms of four different pulse signal components of an excess charge sweep-out drive pulse signal supplied to four adjacent transfer electrodes of vertical charge transfer sections of the image sensor in the first embodiment shown in FIG. 2.
Figure 6B:
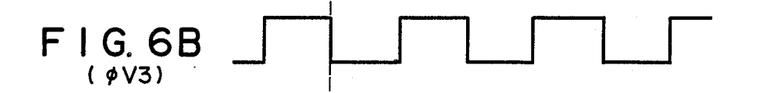
Figure 6C:
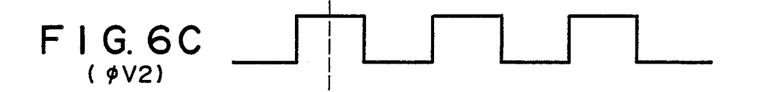
Figure 6D:
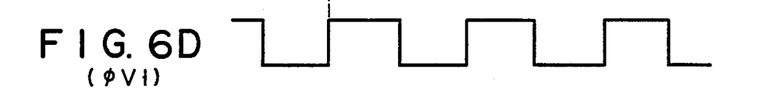

Referring to FIG. 5, an excess-charge sweep-out drive pulse generator is generally indicated by reference numeral "150". Drive pulse generator 150 includes timing pulse generator 152. Generator 152 generates single-phase original pulse signal Pa used in period D and pulse signal Pb for designating the start of period D. Generator 152 also generates four timing pulse signals P1, P2, P3, and P4 for forming four-phase clock pulse signals used in periods other than period D. These timing pulse signals P1, P2, P3, and P4 are supplied to voltage level adjusting circuit (or adjuster) 154. Adjuster 154 converts these pulse signals P1 to P4 into pulse signals P5, P6, P7, and P8 having sufficient potential levels necessary for driving corresponding vertical charge transfer sections VT. Pulse signals Pa and Pb are supplied to single-phase pulse generator 156. Generator 156 generates positive and negative pulse signals Pc and Pd only during period D. These pulse signals Pc and Pd are supplied to offset circuit 158, and are offset thereby. Circuit 158 is connected to two D.C. batteries Va and Vb. Pulse signal Pc is offset by D.C. voltage Va and is converted to pulse signal Pe. Pulse signal Pd is offset by D.C. voltage Vb and is converted to pulse signal Pf.

Four switching circuits 160, 162, 164, and 166 are connected to four outputs of voltage level adjuster 154. Switching circuit 160 receives pulse signal P5 output from adjuster 154 and pulse signal Pe output from offset circuit 158, and selectively outputs one of these input pulse signals P. Switching circuit 162 receives pulse signal P6 output from adjuster 154 and pulse signal Pf output from offset circuit 158, and selectively outputs one of these input pulse signals P. Switching circuits 164 and 166 have inputs respectively connected to D.C. batteries Vc and Vd. Switching circuit 164 receives pulse signal P7 output from adjuster 154 and a D.C. voltage from battery Vc, and performs a switching operation to selectively output these input signals. Switching circuit 166 performs a switching operation to selectively output one of pulse signal P8 output from adjuster 154 and a D.C. voltage from battery Vd. The output signals from four switching circuits 160, 162, 164, and 166 are supplied, as charge transfer drive clock pulse signals $\phi V1$, $\phi V2$, $\phi V3$, and $\phi V4$, to the transfer electrodes (see FIG. 4A) of vertical charge transfer sections VT of CCD image sensor 10 through corresponding clock drivers 168, 170, 172, and 174.

FIGS. 7A to 7D show the signal waveforms of charge transfer drive clock pulse signals $\phi V1$, $\phi V2$, $\phi V3$, and $\phi V4$. For the sake of comparison, FIGS. 6A to 6D show the signal waveforms of respective phases of the corresponding four-phase drive pulse signal used in the first embodiment. In the four-phase drive pulse signal shown in FIGS. 6A to 6D, if one period is given by T1, respective phase signal components are phase-shifted from each other by $T2 = T1/4$ ($= 90$ degrees). In order to generate the four-phase drive pulse signal having the above signal components at high speed, a relatively high-performance clock driver is necessary.

Figure 7A:
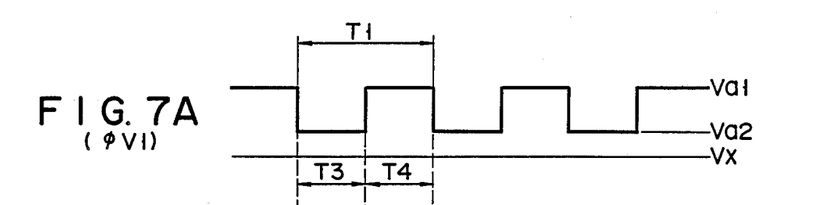
FIGS. 7A to 7D are diagrams showing waveforms of four different pulse signal components of an excess charge sweep-out drive pulse signal supplied to four adjacent transfer electrodes of vertical charge transfer sections of the image sensor in the second embodiment shown in FIG. 5.
Figure 7B:
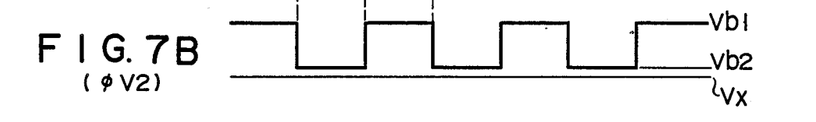
Figure 7C:
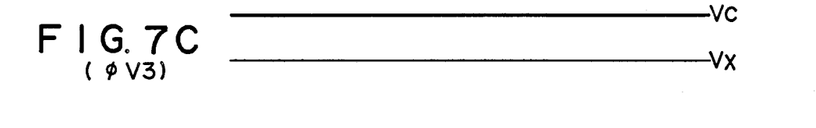
Figure 7D:
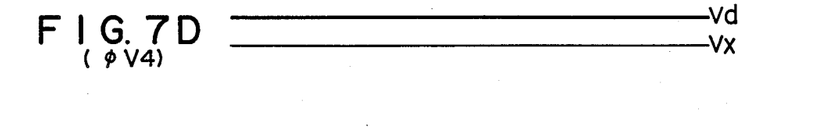

According to excess-charge sweep-out drive pulse signal generator 150 of the second embodiment shown in FIG. 5, the output signals from clock drivers 168 and 170, i.e., first and second pulse components $\phi V1$ and $\phi V2$, are in phase, as can be seen from FIGS. 7A and 7B. The output signals from clock drivers 172 and 174, i.e., third and fourth pulse components $\phi V3$ and $\phi V4$, are in phase, as can be seen from FIGS. 7C and 7D. The D.C. voltages from batteries Vc and Vd are constant voltages. In FIGS. 7A to 7D, reference symbol "Vx" designates a reference potential level. High and low voltage levels Va1 and Va2 of first pulse component $\phi V1$ (in other words, the amplitude of component $\phi V1$) is determined by offset circuit 158 using offset voltage Va. High and low voltage levels Vb1 and Vb2 of first pulse component $\phi V2$ (in other words, the amplitude of component $\phi V2$) is determined by offset circuit 158 using offset voltage Vb.

Figure 8A:
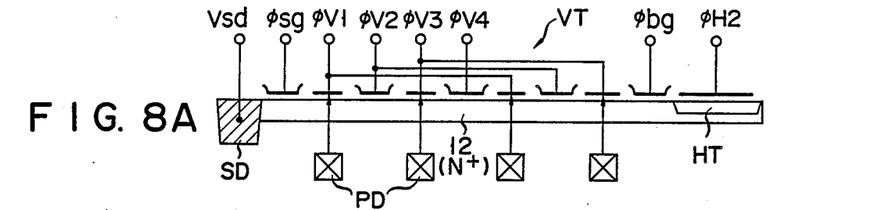
FIGS. 8A to 8F are views illustrating a change over time in a potential well formed in a substrate region under a vertical charge transfer section in order to explain how to transfer excess charges to a drain section in the vertical charge transfer section of the image sensor when the excess-charge sweep-out operation of the image sensor is performed using the drive circuit shown in FIG. 5.
Figure 8B:
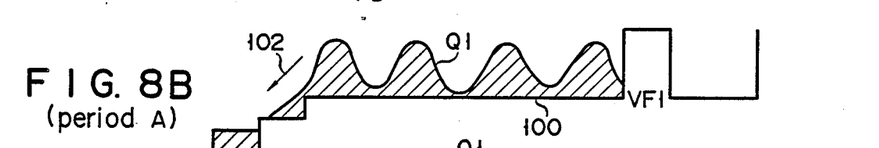
Figures 8C, 8D:
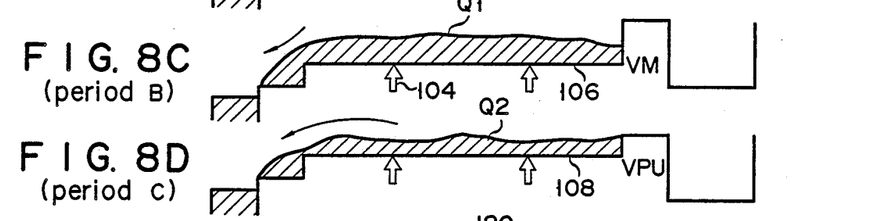

The excess-charge sweep-out operation performed using pulse signal generator 150 shown in FIG. 5 will be described hereinafter in detail with reference to FIGS. 8A to 8F. The sectional structure of image sensor 10 shown in FIG. 8A corresponds to the sectional structure taken along line "4A—4A" of the image sensor shown in FIG. 2. The first step of the excess-charge sweep out operation (performed during periods A to C included in vertical blanking period Tb) of this embodiment is the same as that in the first embodiment. Therefore, excess charge distributions shown in FIGS. 8B to 8D are the same as those in FIGS. 4B to 4D.

During vertical blanking period Tb, when the excess-charge sweep-out operation of the present invention enters the second charge sweep-out step, i.e., period D, pulse generator 150 shown in FIG. 5 supplies a single-phase drive pulse signal $\phi sw'$ for sweeping out excess charges to the transfer electrodes of vertical charge transfer sections VT of CCD image sensor 10. In this operation mode, bottom gate G1 (see FIG. 2) is closed, and drain gate G2 is opened, in the same manner as in the first embodiment described previously.

Figure 8E:
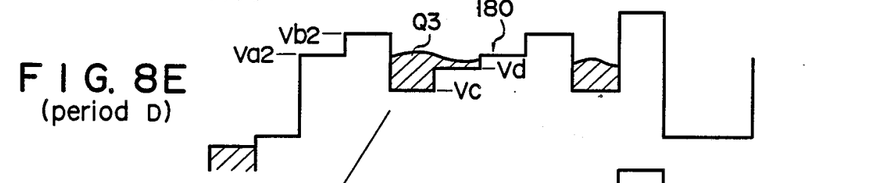

After completion of the first charge sweep-out step, in order to discharge excess charges Q2 left in potential wells 108 of the channel regions of sections VT to drain layer SD, potential well patterns 180 which descend stepwise as shown in FIG. 8E are formed in the channel regions of sections VT during first half T3 (see FIG. 7B) of period D (in FIG. 8E, only one potential well pattern is illustrated for the sake of illustrative simplicity). In one potential well pattern 180, the deepest potential well portion is formed upon application of pulse $\phi V3$ having a level of D.C. voltage Vc. The second deepest potential well portion is formed upon application of pulse $\phi V4$ having a level of D.C. voltage Vd. The third deepest potential well portion is formed upon application of pulse $\phi V2$ having a level of voltage Va2. The shallowest potential well portion is formed upon application of pulse $\phi V1$ having a level of voltage Vb2. Residual excess charges Q2 are left in potential well pattern 180. The excess charges left in given potential well pattern 180 are indicated by "Q3" in FIG. 8E.

Figure 8F:
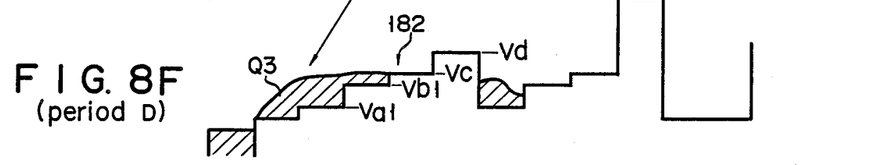

During second half T4 of period D, as shown in FIGS. 7A and 7B, pulses $\phi V1$ and $\phi V2$ are simultaneously changed (while being kept in phase) to have high levels Va1 and Vb1, respectively. Therefore, the bottom of the shallowest well of potential well pattern 180 shown in FIG. 8E is changed from Vb2 to Vb1 (deeper than Vc as shown in FIG. 8F), and at the same time, the bottom of the third deepest well of pattern 180 is changed from Va2 to Va1 (deeper than Vb1, as shown in FIG. 8F, so that the deepest potential well is formed at this time). Thus, potential well patterns 182 are formed in the channel regions of vertical charge transfer sections VT, as shown in FIG. 8F. Potential well pattern 182 has the sectional shape which has well Vd of immediately preceding pattern 180 as its shallowest well and descends stepwise therefrom. Potential well pattern 182 is moved to come closer to drain layer SD, so that excess charges Q3 can be discharged to drain layer SD.

According to this embodiment, since single-phase clock pulse signal $\phi sw'$ is used as a drive pulse for sweeping out excess charges, the excess charges can be swept out at relatively high speed during period D even if a low-speed clock driver is used. The high-speed excess-charge sweep-out operation allows the time length of period D to be shortened, and hence, blooming and afterimage suppression effects can be further improved.

Although the invention has been described with reference to a specific embodiment, it shall be understood by those skilled in the art that numerous modifications may be made that are within the spirit and scope of the inventive contribution.

For example, in the above embodiments, the excess charge sweep-out operation is performed using four-phase and single-phase drive signals. However, three-phase and two-phase drive signals may be utilized. In each embodiment described above, a bottom gate electrode for turning on/off passage of signal charges is provided between the vertical and horizontal CCDs. A final-stage transfer electrode of the vertical CCD may be used as the gate electrode. Similarly, as the gate electrode on the side of the sweep-out drain, the final-stage transfer electrode of the vertical CCD may be utilized. in each embodiment described above, the case has been exemplified wherein the operation is performed on the basis of the NTSC standard TV scheme. The present invention can be applied to the PAL scheme, and can also be applied to a solid-state image sensing device in a "high-vision" TV camera which can obtain a high-precision image. In the case of the "high-vision" TV camera, since the number of transfer stages of the vertical CCD is about 500, the number of sweep-out pulses must be determined accordingly.

In each embodiment described above, a monochrome camera using a single CCD image sensor has been described. The present invention is not limited to this. More specifically, when the present invention is applied to a three-board color camera using three elements or to a single-board color camera using a single element, a high-sensitive, low-smear, high-quality color reproduced image with wide dynamic range free from image lag can be obtained.

What is claimed is:

1. An image sensing device comprising:
   (a) a CCD image sensor, comprising
      semiconductive cells which are aligned on a substrate to define picture elements of said image sensor and to form at least one linear cell array,
      a photosensitive layer which is arranged above said substrate, is conducted to said semiconductive cells, and photovoltaicly generates charges upon incidence of image light thereonto, the charges being supplied to said semiconductive cells and stored therein,
      a vertical charge transfer section which is formed on said substrate and has a plurality of transfer electrodes aligned along said linear cell array, said vertical charge transfer section having first and second end portions,
      a horizontal charge transfer section provided on said substrate to be coupled to the first end portion of said vertical charge transfer section, and
      a semiconductive drain layer provided on said substrate to be coupled to the second end portion of said vertical charge transfer section; and
   (b) driver means, electrically connected to said image sensor, for (i) in a signal charge readout mode of said image sensor, driving said vertical charge transfer section to move charges flowing from said linear cell array in a first transfer direction and to partially transfer the charges to said horizontal charge transfer section, and for (ii) in an excess charge sweep-out mode performed in a vertical blanking period of said image sensor, driving said vertical charge transfer section to move residual charges left therein in a second transfer direction opposite to the first transfer direction and to transfer the charges to said drain layer, whereby the residual charges are discharged to said drain layer as excess charges.

2. The device according to claim 1, wherein said image sensor comprises:
   a first gate layer, provided on said substrate between said first end portion of said vertical charge transfer section and said horizontal charge transfer section, for controlling a charge flow therebetween; and
   a second gate layer, provided on said substrate between said second end portion of said vertical charge transfer section and said drain layer, for controlling a charge flow therebetween.

3. The device according to claim 2, wherein said driver means comprises:
   a gate control circuit, connected to said first and second gate layers, for generating a gate control signal for opening said first gate layer and closing said second gate layer in the signal charge readout mode, and for closing said first gate layer and opening said said second gate layer in the excess-charge sweep-out mode, whereby the excess charges are transferred and discharged to said drain layer through said second gate layer during the vertical blanking period.

4. The device according to claim 3, wherein said driver means comprises:
   a first excess-charge sweep-out driver which is electrically connected to said vertical charge transfer section and which supplies a first excess-charge sweep-out drive pulse signal which serves to apply identical voltages to said transfer electrodes of said vertical charge transfer section during a first period of the vertical blanking period, the identical voltages being adapted to identically change, so that a potential well which has a substantially uniform depth and stores charges left therein is formed in a substrate region immediately under said vertical charge transfer section, and said potential well is changed to become shallower gradually or stepwise in accordance with changes in voltages of the first excess-charge sweep-out drive pulse signal, whereby a part of the residual charges is transferred to said drain layer.

5. The device according to claim 4, wherein said driver means comprises:
   a second excess-charge sweep-out driver which is electrically connected to said vertical charge transfer section and which supplies a second excess-charge sweep-out drive pulse signal to said transfer electrodes of said vertical charge transfer section during a second period of the vertical blanking period, whereby the remaining part of the residual charges in said vertical charge transfer section is forcibly transferred to said drain layer in response to the second excess-charge sweep-out drive pulse signal.

6. The device according to claim 5, wherein said second excess-charge sweep-out driver generates, as the second excess-charge sweep-out drive pulse signal, a multi-phase clock pulse signal having clock pulse components whose phases are shifted from each other by a predetermined angle.

7. The device according to claim 5, wherein said second excess-charge sweep-out driver generates a single-phase clock pulse signal as the second excess-charge sweep-out drive pulse signal.

8. The device according to claim 5, wherein said second excess-charge sweep-out driver combines in-phase clock pulse signals which are level-adjusted by different voltages and at least one D.C. voltage having a constant potential so as to generate a voltage signal having a descending stepwise waveform component, which is supplied to said transfer electrodes of said vertical charge transfer section as the second excess-charge sweep-out drive pulse signal, whereby transfer of the remaining part of the residual charge in said vertical charge transfer section to said drain layer is accelerated.

* * * * *